United States Patent [19]

Haragashira

[11] Patent Number: 4,890,063
[45] Date of Patent: Dec. 26, 1989

[54] PROBE COIL SYSTEM FOR MAGNETIC RESONANCE APPARATUS

[75] Inventor: Motoji Haragashira, Tochigi, Japan

[73] Assignee: Kabushiki Kaisha Toshiba, Kawasaki, Japan

[21] Appl. No.: 230,195

[22] Filed: Aug. 9, 1988

[30] Foreign Application Priority Data

Aug. 10, 1987 [JP] Japan ................. 62-199622

[51] Int. Cl.$^4$ ........................... G01R 33/20
[52] U.S. Cl. .................... 324/322; 324/318; 334/55
[58] Field of Search ............. 324/313, 318, 322; 333/174, 175, 176; 334/55; 343/722, 745, 749, 750

[56] References Cited

U.S. PATENT DOCUMENTS

| 4,602,213 | 7/1986 | Sugiura ............... 324/313 |
| 4,620,155 | 10/1986 | Edelstein ............. 324/322 |
| 4,633,181 | 12/1986 | Murphy-Boesch et al. ...... 324/322 |
| 4,694,255 | 9/1987 | Hayes ................ 324/318 |
| 4,788,503 | 11/1988 | Van Heelsbergen ........ 324/322 |

FOREIGN PATENT DOCUMENTS

| 0141383 | 5/1985 | European Pat. Off. . |
| 0175129 | 3/1986 | European Pat. Off. . |
| 0276510 | 8/1988 | European Pat. Off. . |
| 0031978 | 2/1986 | Japan ................. 324/313 |
| 1264310 | 10/1986 | U.S.S.R. ............. 334/55 |

OTHER PUBLICATIONS

Chen, et al., "A Study of R.F. Power Deposition in Imaging", Book of Abstracts, vol. 2, Society of Magnetic Resonance in Medicine (Fourth Annual Meeting, Aug. 1985), London, U.K., pp. 918-919.
Shen, et al., "R.F. Coil Design for NMR Imaging", Book of Abstracts, vol. 2, Society of Magnetic Resonance in Medicine (Fourth Annual Meeting, Aug. 1985), London, U.K., pp. 1117-1118.

Primary Examiner—John Chapman
Assistant Examiner—Kevin D. O'Shea
Attorney, Agent, or Firm—Foley & Lardner, Schwartz, Jeffery, Schwaab, Mack, Blumenthal & Evans

[57] ABSTRACT

A probe coil system for a magnetic resonance (MR) apparatus includes a plurality of coil elements, a plurality of shortening capacitor elements, and first and second capacitors. The plurality of shortening capacitor elements are inserted between and in series with the coil elements. The first capacitor is connected in parallel with the coil elements and the shortening capacitor elements. The second capacitors are connected at least in series with the coil elements and the shortening capacitor elements. Each of the shortening capacitor elements includes a plurality of capacitors and a plurality of switches, selectively opened and closed to switch a total capacitance of the plurality of capacitors, allowing selection of one of a plurality of resonance frequencies by adjusting the first and second capacitors within a predetermined range.

8 Claims, 5 Drawing Sheets

FIG. 1

PRIOR ART

PROBE COIL SYSTEM FOR MAGNETIC RESONANCE APPARATUS

BACKGROUND OF THE INVENTION

1. Field of the Invention

The present invention relates to a probe coil system, used in a magnetic resonance (MR) apparatus for obtaining anatomical or qualitative information of an object utilizing an MR phenomenon, for applying an electromagnetic wave signal for exciting an MR phenomenon in an object and/or detecting an MR signal from the object and, more particularly, to a probe coil system for an MR apparatus capable of transmitting an RF excitation signal corresponding to a plurality of types of resonance frequencies or detecting an RF resonance signal.

2. Description of the Related Art

The MR phenomenon is a phenomenon in which an atomic nucleus placed in a static magnetic field and having a spin or magnetic moment resonantly absorbs only an electromagnetic wave having a predetermined frequency. This atomic nucleus resonates at angular frequency $\omega 0$ ($\omega 0 = 2\pi \nu 0$, $\nu 0$: Larmor frequency) represented as follows:

$$\omega 0 = \gamma H O$$

where $\gamma$ is the specific gyromagnetic ratio of the specific atomic nucleus and $HO$ is the static magnetic field intensity.

In such a system for diagnosing a living organism utilizing the MR phenomenon, the MR phenomenon is excited in an object, and an electromagnetic wave of the resonance frequency is induced after absorption of the resonance is received and processed, thereby obtaining information of, e.g., a tomographic image of, the object.

In this system, in principle, the MR phenomena can be excited in and MR signals can be acquired from all portions of the object. However, due to limitations of an apparatus and clinical demands for a diagnosis image, actual conventional apparatuses utilize a gradient magnetic field to perform excitation of MR and acquisition of the MR signal for a specific portion, e.g., a specific slice, of an object.

Figure 1:
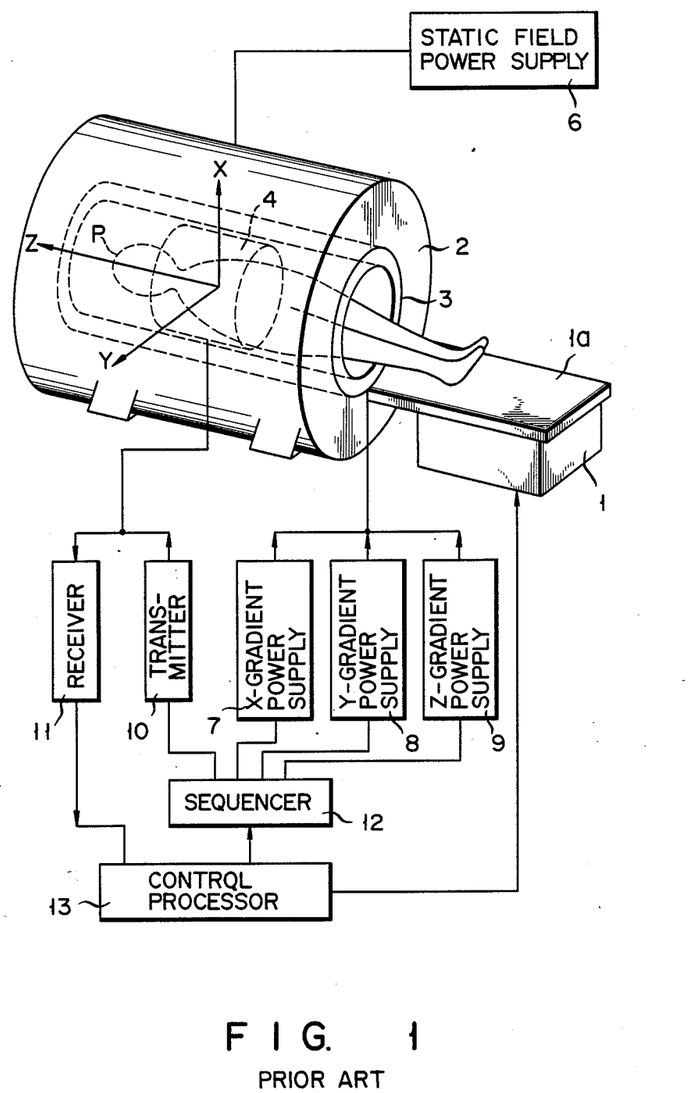
FIG. 1 is a view showing a conventional arrangement of an MR imaging system.

For example, as shown in FIG. 1, a conventional medical diagnostic MR imaging apparatus comprises bed 1, static magnetic field coil 2, gradient magnetic field generation coil 3, probe coil system 4, static field power supply 6, X-, Y-, and Z-gradient power supplies 7, 8, and 9, transmitter 10, receiver 11, sequencer 12, and control processor 13. Bed 1 includes movable board 1a on which object P is placed. Static magnetic field coil 2 is driven by power supply 6 and generates a static magnetic field. Gradient magnetic field generation coil 3 is driven by power supplies 7, 8, and 9 and generates X-, Y-, and Z-gradient magnetic fields, respectively. Probe coil system 4 comprises at least one coil including a transmitting coil and a receiving coil or a transmitting-/receiving coil for both transmission and reception. System 4 is driven by transmitter 10 and transmits a rotational magnetic field which is an RF signal for exciting MR. The MR signal induced in the object is detected by receiver 11 through system 4. Sequencer 12 drives and controls power supplies 7, 8, and 9 and transmitter 10 in accordance with a predetermined pulse sequence. Control processor 13 controls operations of bed 1 and sequencer 12 and processes the MR signal detected by receiver 11. Processor 13 includes a display and outputs a result of signal processing, e.g., displays the result on the display.

This system is used as follows.

Object P is placed on board 1a of bed 1, and board 1a is moved so that object P is located in a static magnetic field generated by static magnetic field coil 2. Then, transmitter 10 is driven by sequencer 12 in accordance with the predetermined sequence and causes probe coil system 4 to transmit, e.g., a 90° or 180° pulse as a rotational magnetic field, i.e., an excitation pulse for exciting MR. At the same time, power supplies 7, 8, and 9 are driven to cause gradient magnetic field generation coil 3 to apply a gradient magnetic field to object P.

Upon application of the excitation pulse and the gradient magnetic field, an MR phenomenon is generated in at least a predetermined portion of object P, and an induced MR signal is detected by system 4. The MR signal is fetched by control processor 13 and subjected to image processing such as image reconstruction processing. As a result, imaging information such as a tomographic image is obtained and displayed.

System 4 will be described below.

In order to obtain anatomical information of a living organism such as a slice image and qualitative information such as a spectroscopy using the above apparatus, a plurality of nuclear species are used or the static magnetic field is varied (e.g., an apparatus using a rampable magnet capable of enhancing and reducing the static magnetic field intensity in a short time period is used for spectroscopy). In this case, an RF signal of a resonance frequency applied from system 4 to object P or detected from object P differs in accordance with the type of atomic nucleus or with the static magnetic field intensity even if the atomic nucleus is not changed.

Examples are 1H, 21.3 MHz at 0.5 T, 42.6 MHz at 1 T, and 64 MHz at 5 T; 31p, 8.6 MHz at 0.5 T, 17.2 MHz at 1 T, and 25.8 MHz at 1.5 T; and 13C, 5.4 MHz at 0.5 T, 10.7 MHz at 1 T, and 16.1 MHz at 1.5 T.

In this case, a tuning frequency of a conventional probe coil system 4 is unconditionally determined in accordance with an inductance of the coil. For this reason, in order to use a plurality of nuclear species and to vary the static magnetic field, the tuning frequency of system 4 must be variably controlled.

According to an abstract "R.F. Coil Design for NMR Imaging (J. F. Shen and I. J. Lowe)" of the "Society of Magnetic Resonance in Medicine (Fourth Annual Meeting, Aug. 19–23, 1985)", a tuning frequency can be changed by inserting a shortening capacitor in a circuit system including a coil.

A probe coil system in which a shortening capacitor is inserted will be described below.

Figure 2:
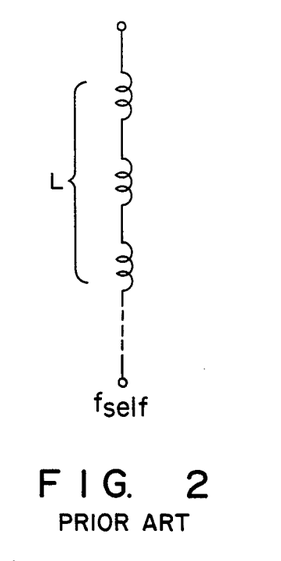
FIG. 2 is a circuit diagram showing an arrangement of a coil portion in a conventional probe coil system.
Figure 3:
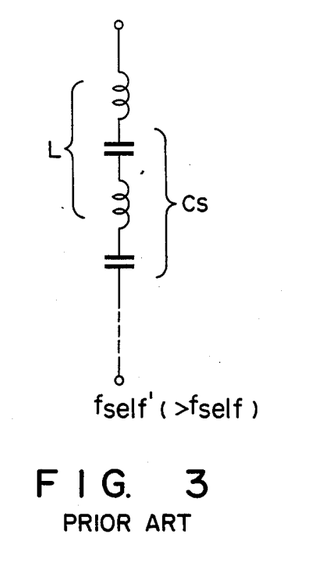
FIG. 3 is a circuit diagram showing another arrangement of the coil portion in the conventional probe coil system.

FIG. 2 is a circuit diagram showing coil L consisting of a plurality of coil elements of the probe coil system. FIG. 3 shows a circuit in which shortening capacitors each consisting of a plurality of capacitance elements are inserted between a plurality of coil elements of coil L similar to that shown in FIG. 2. In this case, assuming that the self resonance frequency of the circuit shown in FIG. 2 is fself, the self resonance frequency fself' obtained when shortening capacitor Cs consisting of a plurality of capacitor elements is inserted as shown in FIG. 3 is represented as follows:

$$fself' > fself$$

Figure 4:
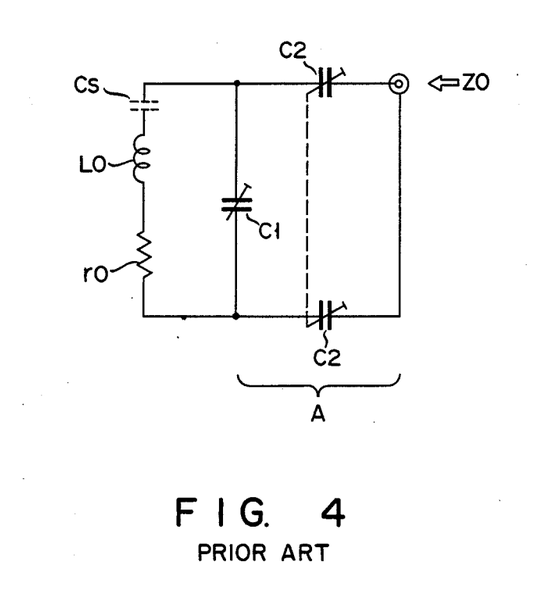
FIG. 4 is a circuit diagram showing an equivalent circuit of the conventional probe coil system.

FIG. 4 shows an equivalent circuit of a probe coil system obtained by connecting, in a circuit mainly consisting of the coil shown in FIG. 2, tuning capacitor C1 in parallel with the coil and matching capacitor C2 in series therewith.

In FIG. 4, reference symbol L0 dentes an inductance of the coil; r0, an equivalent resistance caused by the coil itself and object P inserted therein; and Z0, an output impedance of the probe coil system which is set to coincide with a characteristic impedance of a cable connected to the probe coil system. If a circuit including the shortening capacitor shown in FIG. 3 is a main element of a circuit system of this probe coil system, shortening capacitor Cs is a capacitance connected in series with L0 and Z0 as indicated by broken lines representing Cs.

In this manner, a tuning frequency can be changed by inserting shortening capacitor Cs in a circuit system including the coil of the probe coil system. However, when shortening capacitor Cs is inserted, the equivalent resistance r0 and output impedance Z0 are changed. Therefore, tuning capacitor C1 and matching capacitor C2 must be adjusted.

For this reason, if shortening capacitor Cs inserted in the coil portion is a continuously variable capacitor and the capacitance of shortening capacitor Cs is changed to switch the tuning frequency to a plurality of different frequencies, the number of portions of the system to be adjusted is significantly increased. Therefore, the frequency cannot be practically tuned to a plurality of tuning frequencies. For this reason, in practice, a circuit in which a shortening capacitor is not inserted as shown in FIG. 2 and a circuit in which a suitable shortening capacitor is inserted as shown in FIG. 3 are independently used. That is, the tuning frequency is fixed in the conventional apparatus.

The tuning frequency can be varied by switching a circuit in which the shortening capacitor is not inserted and a circuit in which the shortening capacitor is inserted. In this case, however, capacitors C1 and C2, which constitute a matching circuit, can be used as they are only when the shortening capacitor has a particular capacitance, which is very rare in practice. As a result, the arrangement is complicated, and only two tuning frequencies can be set. Therefore, according to the conventional techniques, the MR signals cannot be acquired using a plurality of nuclear species or varying a static magnetic field.

SUMMARY OF THE INVENTION

It is, therefore, an object of the present invention to provide a probe coil system for an MR apparatus capable of easily being set to a plurality of tuning frequencies.

The probe coil system for an MR apparatus according to the present invention, including a circuit system including a coil and used in an MR apparatus, for performing at least one application of an RF magnetic field for exciting MR in an object and detection of an MR signal generated from the object by the MR, comprises: a plurality of coil elements constituting the coil; a plurality of shortening capacitor elements inserted between and in series with the coil elements; a first capacitor including a variable capacitor at least equivalently connected in parallel with a series circuit including the coil elements and shortening capacitor elements; and a second capacitor including variable capacitors at least equivalently connected in series with both ends of the series circuit the coil elements and the shortening capacitors, wherein each of the shortening capacitor elements comprises a plurality of capacitances and a plurality of switches, selectively opened and closed to switch a total capacitance of the plurality of capacitances, for selecting one of a plurality of resonance frequencies by adjusting the first and second capacitors within a predetermined range.

With the above arrangement, a total capacitance of the shortening capacitor elements including the plurality of capacitors can be properly varied by combining opened and closed states of the plurality of switches, thereby setting a plurality of tuning frequencies. In addition, since this function can be performed by only adjusting a capacitance of a tuning capacitor within a predetermined range, the number of portions of the system to be adjusted is small.

DETAILED DESCRIPTION OF THE PREFERRED EMBODIMENTS

An embodiment of a probe coil system for an MR apparatus according to the present invention will be described below with reference to the drawings.

Figure 5:
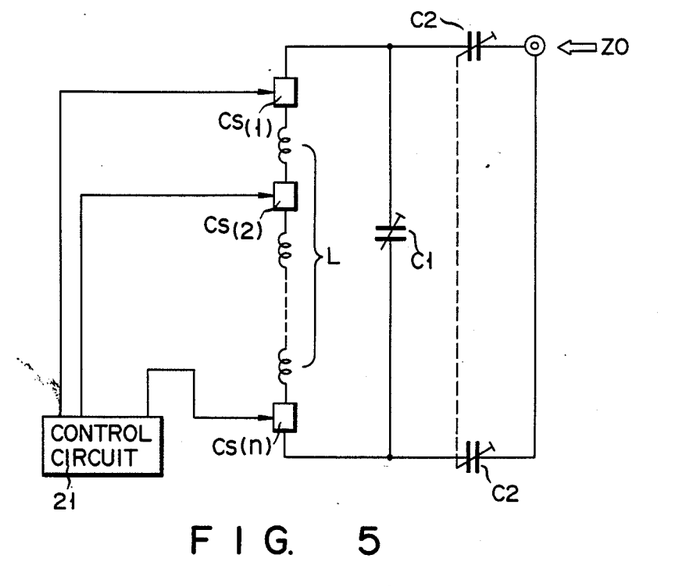
FIG. 5 is a circuit diagram showing an arrangement of an embodiment of a probe coil system for an MR apparatus according to the present invention.
Figure 6:
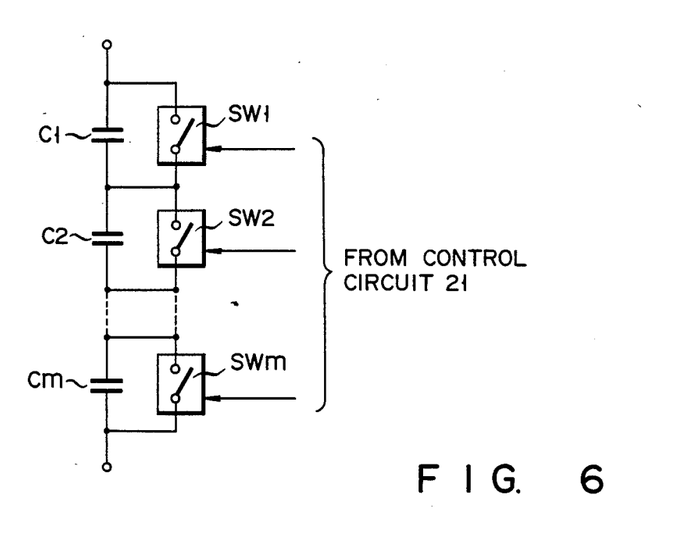
FIG. 6 is a circuit diagram showing an arrangement of a coil element of the system shown in FIG. 5.
Figure 7:
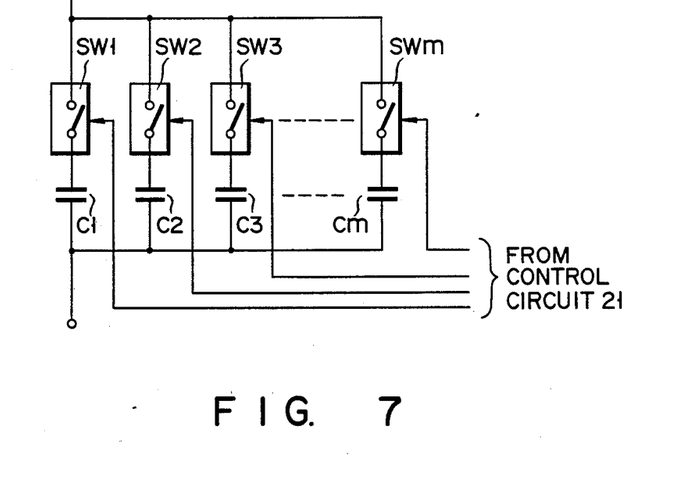
FIG. 7 is a circuit diagram showing another arrangement of the coil element of the system shown in FIG. 5.

FIG. 5 is a circuit diagram showing an arrangement of the probe coil system, and FIGS. 6 and 7 are detailed circuit diagrams of a shortening capacitor shown in FIG. 5.

In the probe coil system shown in FIG. 5, a plurality of shortening capacitor elements $Cs(i)$, i.e., $Cs(1)$, $Cs(2)$, ... $Cs(n)$ ($n \geq 2$) are inserted between and in series with a plurality of coil elements constituting coil L. As shown in FIG. 6, in each shortening capacitor $Cs(i)$, a plurality of capacitors $Ci$, i.e., $C1, C2, \ldots Cm$ are connected in series with each other, and a plurality of switches $SWi$, i.e., $SW1, SW2, \ldots SWm$ each including a static switch using a PIN diode or a contact switch using a relay or the like are connected in parallel with corresponding capacitors $Ci$. Alternatively, instead of the arrangement shown in FIG. 6, shortening capacitor $Cs(i)$ is arranged such that capacitors $Ci$ ($C1, C2, \ldots$ Cm) and switches SWi (SW1, SW2, ... SWm) are connected in series with each other and these series circuits are connected in parallel with each other as shown in FIG. 7.

The plurality of shortening capacitor elements Cs(i) (Cs(1), Cs(2), ... Cs(n)) shown in FIG. 5 are switched by control circuit 21.

If the total capacitance of Cs(i) is defined as Cs(i) (i=1, 2, ... n; n≧2), the following condition is satisfied:

$$Cs = \{(1/\bar{C}s(1)) + (1/\bar{C}s(2)) + \ldots + (1/\bar{C}s(n))\}^{-1}$$

Control circuit 21 selectively opens and closes switches SWi (SW1, SW2, ... SWm) shown in FIG. 6 or 7 in accordance with a predetermined switching pattern.

A function of the probe coil system having the above arrangement will be described below.

Figure 8:
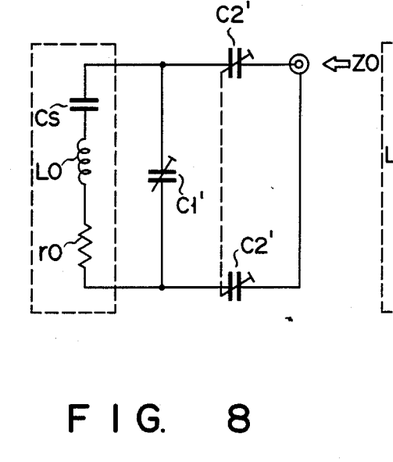
FIG. 8 is a circuit diagram showing an equivalent circuit of the system shown in FIG. 5.

FIG. 8 shows an equivalent circuit of the probe coil system in which shortening capacitor Cs is inserted in a coil portion. The circuit in FIG. 8 can be represented by an equivalent circuit shown in FIG. 9 by equivalent conversion.

Figure 9:
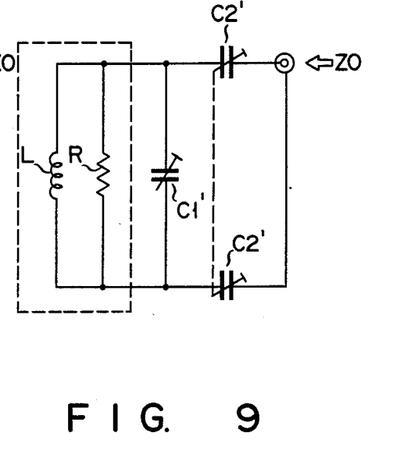
FIG. 9 is a circuit diagram showing an equivalent circuit obtained by further equivalently converting the equivalent circuit shown in FIG. 8.

Since a coil normally has a high Q, $r0 << \{\omega L0 - (1/\omega Cs)\}$ can be assumed, and the following equations can be established:

$$R = r0 + [\{\omega L0 - (1/\omega Cs)\}^2/r0] \quad (1)$$
$$\approx \{\omega L0 - (1/\omega Cs)\}^2/r0$$

$$L = [r0^2 + \{\omega L0 - (1/\omega Cs)\}^2]/\{\omega L0 - (1/\omega Cs)\} \quad (2)$$
$$\approx \omega L0 - (1/\omega Cs)$$

where $\omega = 2\pi f$ (f: resonance frequency).

In addition, since $R < -Z0$ is normally assumed, the following equations can be established:

$$C1' = (1/\omega^2 L) - (1/\omega R)\sqrt{\{(R - Z0)/Z0\}} \quad (3)$$
$$\approx (1/\omega^2 L) - \{1/(\omega\sqrt{Z0R})\}$$
$$= (1/\omega^2 L) - (C2'/2)$$

$$C2' = 2/\{\omega\sqrt{Z0(R - Z0)}\} \quad (4)$$
$$\approx 2/(\omega\sqrt{Z0R})$$

In this case, the following equation (5) can be established by substituting equation (1) into equation (4).

$$C2' \approx 2/[\omega\sqrt{Z0\{L0 - (1/\omega Cs)\}^2/r}\,] \quad (5)$$
$$= 2/\omega^2\{L0 - (1/\omega^2 Cs)\}\sqrt{Z0/r0}$$

where $L0 > 1/\omega^2 Cs$.

An abstract entitled "A Study of R. F. Power Deposition in Imagining", (C. N. Chen, V. J. Sank and D. I. Hoult) of "Society of Magnetic Resonance in Medicine (Fourth Annual Meeting, Aug. 19-23, 1985)" describes how the following equation can be established between power WB consumed by an object and MR frequency f:

$$WB \propto f^{2.4} \quad (6)$$

If alternating magnetic field B1 is proportional to RF current I (i.e., $B1 \propto I$), flip angle θ of spin is given by:

$$\theta = \gamma B1 \Delta t$$

where Δt is the application time of an RF pulse, and an equivalent series resistance of the coil itself is much lower than that caused by an object when the object is loaded. Therefore, it will be understood that the following equation can be established between total equivalent series resistance r0 and frequency f when the object is loaded in the probe coil system:

$$r0 \propto f^{2.4} \quad (7)$$

This is because magnetic field B1 generated by the probe coil system does not depend on frequency f when RF current I flows through the coil constituting the probe coil system. Since $WB \propto I^2 r0$, the following equation can be established from equations (6) and (7):

$$r0 \propto f^{2.4} \propto \omega^{2.4} \quad (8)$$

Figures 10, 11:
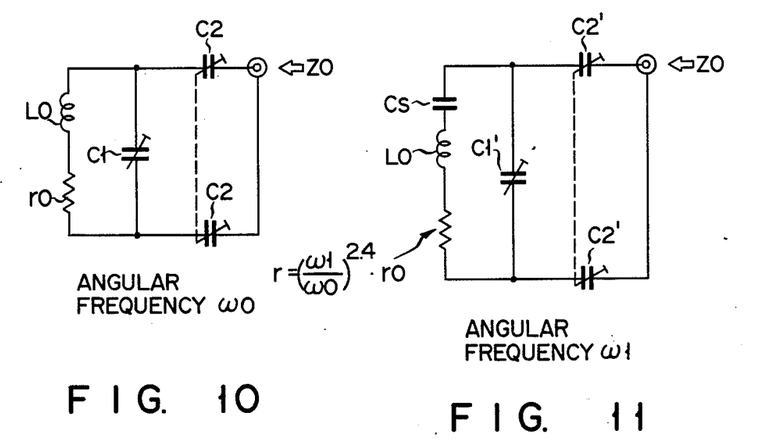
FIGS. 10 and 11 are circuit diagrams for explaining the embodiment shown in FIG. 5.

Assume that two frequencies ω0 and ω1 ($\omega 0 < \omega 1$) are set in the probe coil system. When ω0 is set in the circuit shown in FIG. 10 in which shortening capacitor Cs is not inserted and ω1 is set in the circuit shown in FIG. 11 in which shortening capacitor Cs is inserted, the following approximation (9) can be established in accordance with FIG. 9, and the following approximation (10) can be established by substituting equation (8) into equation (5) in accordance with FIG. 10:

$$C2 \approx 2/\omega 0^2 L0 \sqrt{Z0/r0} \quad (9)$$

$$C2' \approx 2/[\omega 1^2\{L0 - (1/\omega 1^2 Cs)\} \times (\omega 0/\omega 1)^{1.2} \sqrt{Z0/r0}\,] \quad (10)$$

In this case, assuming that $C2 = C2'$ in approximations (9) and (10), the following equation can be obtained:

$$\omega 0^2 L0 = \omega 1^2\{L0 - (1/\omega 1^2 Cs)\} \times (\omega 0/\omega 1)^{1.2}$$

therefore, $$Cs = 1/\omega 1^2 L0\{1 - (\omega 0/\omega 1)^{0.8}\} \quad (11)$$

The following approximation (12) can be obtained from equations (1), (2), and (3):

$$C1 \approx (1/\omega 0^2 L0) - (C2/2) \quad (12)$$
$$C1 \approx [1/\omega 1^2\{L0 - (1/\omega 1^2 Cs)\}] - (C2'/2)$$

The following approximations can be obtained by substituting $$C2 = C2'$$

and $$\omega 0^2 L0 = \omega 1^2\{L0 - (1/\omega 1^2 C)\} \times (\omega 0/\omega 1)^{1.2}$$

into approximation (12):

$$C1 \approx (1/\omega 0^2 L0)(\omega 0/\omega 1)^{1.2} - (C2/2) \quad (13)$$
$$= \{C1 + (C2/2)\}(\omega 0/\omega 1)^{1.2} - (C2/2)$$
$$C1' \approx (\omega 0/\omega 1)^{1.2} \times C1 -$$
$$\{1 - (\omega 0/\omega 1)^{1.2} \times (C2/2)\}$$

Results of the above calculations can be summarized as follows.

In order to change the resonance frequency, i.e., the angular frequency from $\omega 1$ to $\omega 1$, shortening capacitor Cs is set to satisfy:

$$Cs = 1/\omega 1^2 L0\{1-(\omega 0/\omega 1)^{0.8}\}$$

in accordance with approximation (11). As a result, tuning capacitor C1' is obtained as:

$$C1 \approx (\omega 0/\omega 1)^{1.2} \times C1 - \{1-(\omega 0/\omega 1)^{1.2} \times (C2/2)\}$$

in accordance with approximation (13), and matching capacitor C2' is obtained as:

$$C2' \approx C2$$

That is, C1 and C2 are changed within a comparatively small range with respect to the change in angular frequency from $\omega 0$ to $\omega 1$.

Therefore, when the capacitance of tuning capacitor C1 (C1') is preset to be adjustable within a range corresponding to a desired frequency range, portion A shown in FIG. 4 can be used in common for different frequencies by only switching shortening capacitor Cs.

In the probe coil system shown in FIG. 5, by setting the capacitance of the tuning capacitor to be adjustable within a range of C1' corresponding to a predetermined frequency range, the capacitance of shortening capacitor Cs can be changed stepwise with a combination of opened and closed states of switch Swi (i=1, 2, ..., m), and elements other than the tuning and matching capacitors nned not be changed. That is, output impedance Z0 can be adjusted to a predetermined characteristic impedance for a plurality of frequencies.

Figure 12:
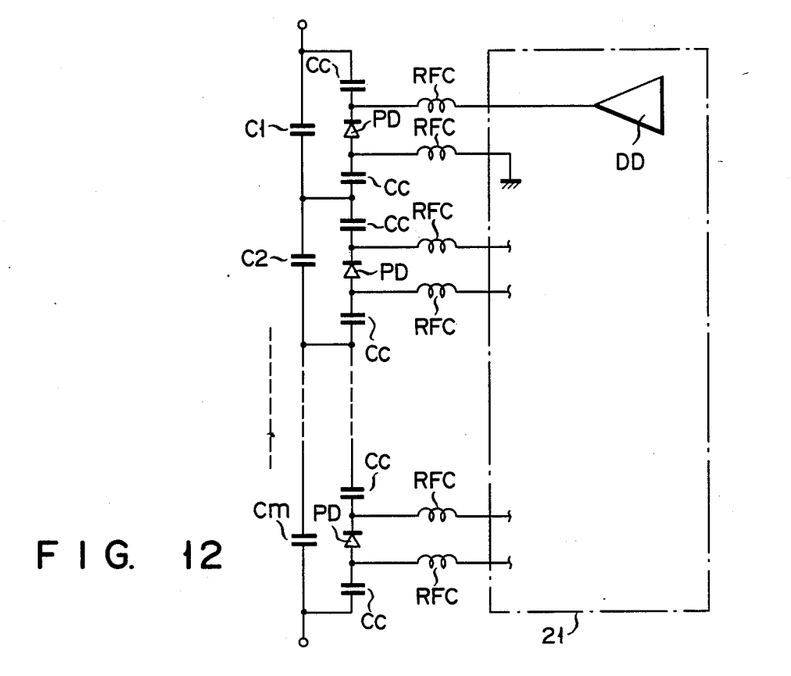
FIG. 12 is a circuit diagram showing an arrangement of a probe coil system according to another embodiment of the present invention.

FIG. 12 is a circuit diagram showing an arrangement of the probe coil system according to another embodiment of the present invention. In this embodiment shown in FIG. 12, switch Swi (i=1, 2, ..., m) in FIG. 5 is constituted by a PIn diode. Coupling capacitor Cc satisfies Cc>>C1, C2, ... Cm. Choke coils RFC are connected to both ends of PIN diodes PD and the other ends of coils RFC are connected to control circuit 21. Coil RFC at one end of each diode PD is connected to diode driver DD in control circuit 21, and choke coil RFC at its other end is grounded.

With the arrangement shown in FIG. 12, even if a capacitance between the terminals of diode PD is large, this capacitance is equivalent to a slightly-increased capacitance of coupling capacitor Cj (j=1, 2, ... N) connected in parallel with diode PD, thereby posing no problem. In addition, since an equivalent resistance of PIN diode PD changes from 0.1 Ω to 10 to 20 KΩ, diode PD functions as an ideal switch.

The present invention is not limited to the above embodiment but can be variously modified without departing from the spirit and scope of the present invention.

What is claimed is:

1. A probe coil system for a magnetic resonance (MR) apparatus which includes a circuit including a coil, said MR apparatus performing at least one application of a radio frequency magnetic field for exciting MR in an object and detecting an MR signal generated from said object by said MR, said probe coil system comprising:
   a plurality of coil elements constituting said coil;
   a plurality of shortening capacitor elements inserted between and in series with said coil elements;
   a first capacitor including a variable capacitor connected at least equivalently in parallel with a series circuit including said coil elements and said shortening capacitor elements; and
   a second capacitor including variable capacitors connected at least equivalently in series with and at both ends of said series circuit,
   wherein each of said shortening capacitor elements comprises a plurality of capacitors and a plurality of switches, selectively opened and closed to switch a total capacitance of said plurality of capacitors and to allow selection of one of a plurality of resonance frequencies by adjusting said first and second capacitors within a predetermined range.

2. A probe coil system according to claim 1, wherein said plurality of capacitors are connected in series with each other and said plurality of switches is connected in parallel with said plurality of capacitors.

3. A probe coil system according to claim 1, wherein said plurality of capacitors are connected in parallel with each other and said plurality of switches is connected in series with said plurality of capacitors.

4. A probe coil system according to claim 1, wherein said plurality of shortening capacitor elements include at least one shortening capacitor element having a first portion of said plurality of capacitors connected in series with each other and some of said plurality of switches connected in parallel with said first portion of capacitors, and at least one shortening capacitor element having a second portion of said plurality of capacitors connected in parallel with each other and some of said plurality of switches connected in series with said second portion of capacitors.

5. A probe coil system according to claim 1, wherein said switches comprise a PIN diode switch.

6. A probe coil system according to claim 1, wherein said switches comprises a relay.

7. A probe coil system according to claim 1, wherein said switches are controlled in association with each other between said plurality of shortening capacitor elements.

8. A probe coil system for a magnetic resonance (MR) apparatus, which includes a circuit including a coil, said MR apparatus performing at least one application of a radio frequency magnetic field for exciting MR in an object and detecting an MR signal generated from said object by said MR, said probe coil system comprising:
   (n−1) coil elements constituting said coil, said (n−1) coil elements equivalently having a total inductance of L0;
   n shortening capacitor elements inserted between and in series with said coil elements, each of said shortening capacitor elements Cs(i) having a capacitance Cs(i), where i=1, 2, ... n and n is an integer greater than or equal to 2;
   a first capacitor including a variable capacitor of capacitance C1 connected at least equivalently in parallel with a series circuit said coil elements and said shortening capacitor elements; and a second capacitor including variable capacitors of capacitance C2 connected at least equivalently in series with and at both ends of said series circuit, wherein each of said shortening capacitor elements comprises a plurality of capacitors and a plurality of switches selectively opened and closed to switch a total capacitance Cs of said plurality of capacitors causing $$Cs = \{(1/\tilde{C}s(1)) + (1/\tilde{C}s(2)) + \ldots + (1/\tilde{C}s(n))\}^{-1}$$

to satisfy $$Cs = 1/[\omega]^2 L0\{1 - (\omega 0/\omega 1)^{0.8}\},$$

where $\omega 0$ is an initial value of an angular frequency and $\omega 1$ is a resonance angular frequency to be selected, such that one of a plurality of resonance frequencies is selected by adjusting said first and second capacitors within a predetermined range.

* * * * *